United States Patent [19]

Roush

[11] Patent Number: 4,466,255

[45] Date of Patent: Aug. 21, 1984

[54] COOLING SYSTEM FOR ELECTRONIC ASSEMBLY

[75] Inventor: M. Dean Roush, Chippewa Falls, Wis.

[73] Assignee: Cray Research, Inc., Minneapolis, Minn.

[21] Appl. No.: 414,448

[22] Filed: Sep. 2, 1982

[51] Int. Cl.³ ............................................. F25D 23/12
[52] U.S. Cl. ................................ 62/259.2; 165/80 C; 361/388
[58] Field of Search .............. 361/388, 385; 165/80 B, 165/80 C; 62/259.1, 259.2

[56] References Cited

U.S. PATENT DOCUMENTS

4,120,021 10/1978 Roush ................................ 165/80 C
4,315,300 2/1983 Parmerlee et al. ................ 165/80 B Primary Examiner—Albert J. Makay
Assistant Examiner—Henry Bennett
Attorney, Agent, or Firm—Merchant, Gould, Smith, Edell, Welter & Schmidt

[57] ABSTRACT

An improved cooling system for electronic assemblies provides cold bars (10) and cold plates (60) for supporting and conducting heat away from a plurality of electronic assemblies (12, 52) attached thereto. A plurality of refrigerant holes (A-F, 70-77) are drilled through the cold bar or plate. End caps (27, 28, 61, 62) have well-like areas forming refrigerant return passages that cooperate with the cold bar or plate to interconnect individual refrigerant holes or groups of holes to form multiple pass refrigerant paths through the cold bar or plate to external connections for connecting to a refrigeration system. The holes are preferably threaded to improve heat transfer characteristics. The pattern, sizing, and grouping of holes can be varied to adjust the design of a particular cold bar or plate to the heat load of a given application.

3 Claims, 12 Drawing Figures

COOLING SYSTEM FOR ELECTRONIC ASSEMBLY

BACKGROUND OF THE INVENTION

This invention pertains generally to the field of cooling systems for electronic apparatus, and in particular to electronic assemblies using cold bars or plates as part of the cooling system for electronic circuitry. While applicable to a variety of electronic fields, it is believed that this invention has its greatest applicability in the field of high speed digital electronic computers, and the description herein of the presently preferred embodiment of the invention illustrates the use of the invention in the computer field.

The continuing trends of electronic circuit miniaturization, and greater complexity and operating speed of large computers have combined to intensify the problem of high heat dissipation and adequate cooling in such computers. Successive generations of integrated circuits have higher packing density in terms of more memory or logic elements within a given integrated circuit size, which is very useful in terms of providing more computer memory and increased computer complexity in a small area, while maintaining the short interconnect path lengths which are required for high speed computer operation. Unfortunately, the increased heat dissipation in such high density devices can exceed the cooling capability of many prior art cooling systems, and upgrading the design of an existing computer by using newer generations of integrated circuits with more functions and more heat generation per chip can exceed the cooling capacity of the system.

Cold bars or cold plates have been used as part of a cooling system, wherein circuit boards or modules are mounted in close thermal contact to the cold bar or cold plate which is cooled by internal refrigerant paths. A successful cooling system for electronic assemblies using cold bars is disclosed in my earlier U.S. Pat. No. 4,120,021, in which the cooling bars have slots along their sides and means are provided for clamping the edges of heat conducting plates of the circuit modules to secure the modules in place and also to conduct away heat generated by the electronic components of the modules. While that system has proved very successful and useful, even greater heat load handling capability is desirable to allow the use of updated electronic modules with higher population of logic or memory circuits per module.

SUMMARY OF THE INVENTION

The present invention provides an improved cold bar/cold plate for use in cooling electronic assemblies, having improved heat load handling capabilities, and having advantages in terms of ease of manufacture and design modifications to tailor individual cold bars to particular applications.

According to this invention, there is provided an improved cooling system for an electronic assembly including a chassis member made of heat conductive material including means for positioning an electronic assembly or module in contact with the chassis member for conducting heat from the electronic assembly to the chassis member. The chassis member has a plurality of refrigerant holes extending therethrough, and end cap means attached to the ends of the chassis member adjacent the ends of the refrigerant holes cooperate with the chassis member to form refrigerant return passages interconnecting at least some of the refrigerant holes to form a refrigerant flow path having multiple passes through the chassis member. Refrigerant connection means are provided in fluid communication with the refrigerant flow path to permit connection to an external refrigeration system for circulating refrigerant therethrough.

According to one aspect of the invention, the refrigerant holes are threaded to provide turbulence and improved heat transfer for the refrigerant flowing therethrough. According to another aspect of a preferred embodiment of the invention refrigerant holes are interconnected in groups which form the passes through the chassis member.

DETAILED DESCRIPTION OF THE PREFERRED EMBODIMENT

Figure 1:
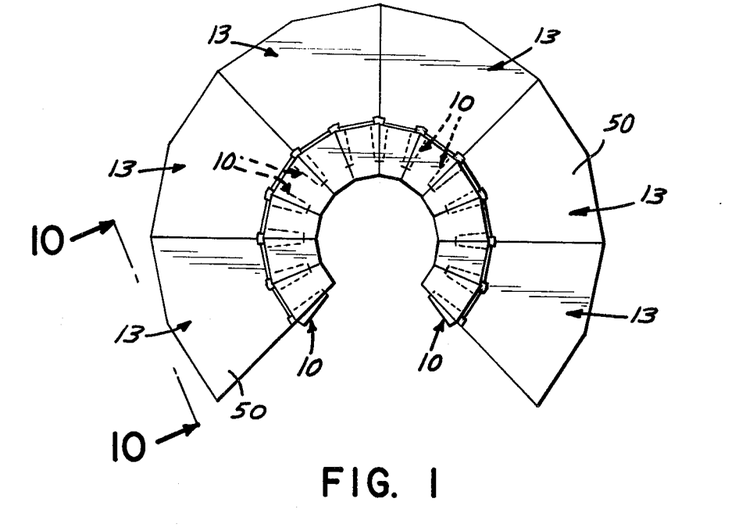
FIG. 1 is a view in top plan of a computer chassis using the cooling system of this invention.
Figure 2:
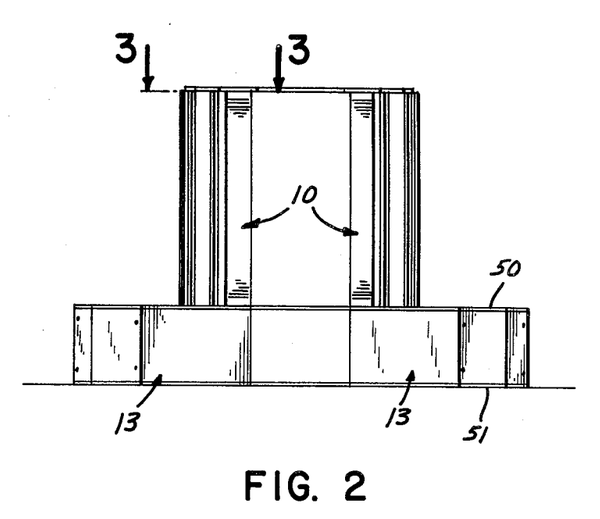
FIG. 2 is a view in side elevation thereof.

FIGS. 1 and 2 show top and side views respectively of a central processor of a computer system in which the present invention can be utilized. The chassis includes a plurality of vertically disposed elongate cooling bars indicated by reference numeral 10. The cooling bars 10 are arranged vertically and spaced apart from each other so that a semi-cylindrical upper chassis configuration is formed. Pairs of adjacent cooling bars 10 define banks therebetween for receiving a plurality of circuit modules, generally indicated by reference numeral 12 in FIG. 3. A plurality of power supply cabinets 13 are positioned around the base of the chassis, and these also include cooling plates for the power supplies.

Figure 3:
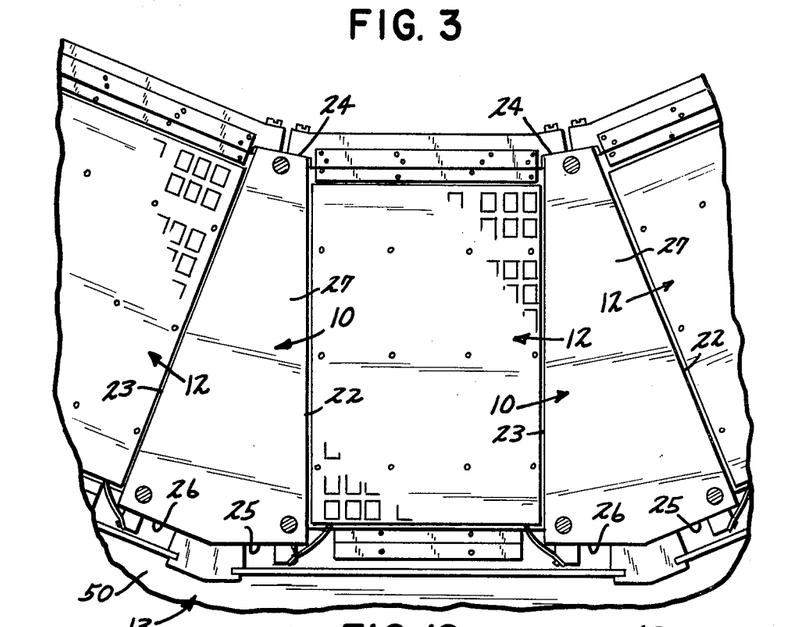
FIG. 3 is a view in top plan of a pair of adjacent cooling bars with a circuit module positioned therebetween.

FIG. 3 shows in greater detail a pair of adjacent cooling bars 10 with an electronic module 12 therebetween. The overall configuration of the computer of FIGS. 1 and 2 and the external details of cooling bars 10 and their cooperation with modules 12 is basically the same as in my earlier U.S. Pat. No. 4,120,021. As shown in greater detail in that patent, the modules consist of a pair of circuit boards sandwiched on either side of a heat conducting plate which has flanges extending beyond the width of the circuit boards for engagement and securing into slots provided in the adjacent faces of the cooling bars. The slots are indicated by reference number 21 in FIGS. 4 and 5. For purposes of simplicity of drawing and clarity of presentation, only a few slots have been shown in FIG. 4, but it will be appreciated that additional slots are in practice provided extending essentially along the full sides of the cooling bar. Additional details as to the construction of the modules 12, and the manner in which the flanges of the heat conducting plates of the modules are clamped and secured in the slots 21 of the cooling bars can be found in my earlier U.S. Pat. No. 4,120,021, as essentially the same module clamping components and systems are used with this invention.

Figure 4:
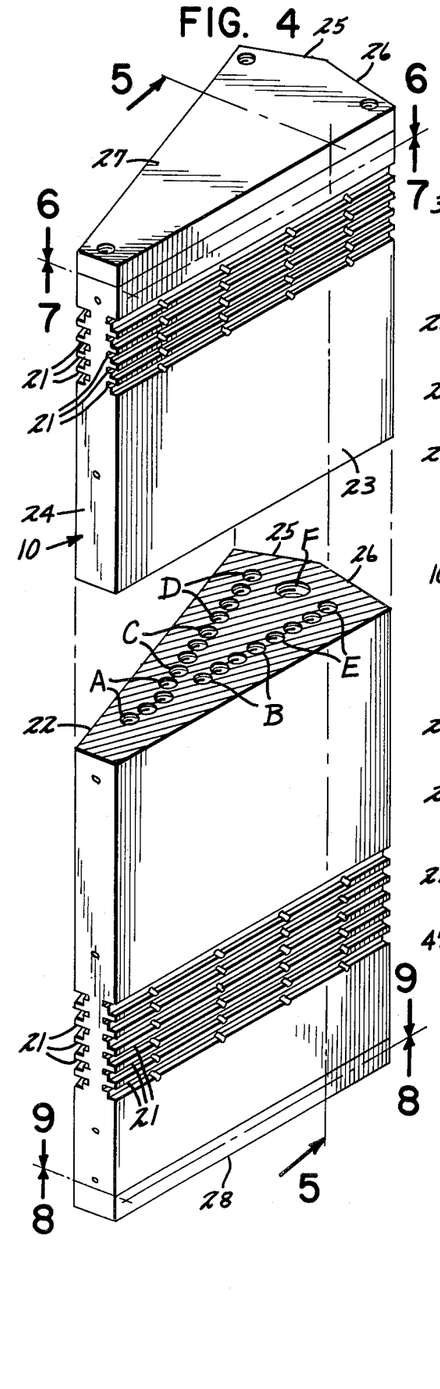
FIG. 4 is a detailed perspective of a cooling bar according to the present invention, portions thereof broken away.

Each of the cooling bars 10 comprises an elongate aluminum bar having a generally wedge shaped cross section, with machined faces 22, 23 having the slots 21 as discussed above. As seen in FIG. 4, opposite faces 22, 23, diverge at an acute angle from each other from a narrow front surface 24 towards a pair of back surfaces 25, 26 which meet at a slight angle along the center line of the cooling bar. Although surfaces 25, 26 cannot be seen in the orientation of FIG. 4, their locations are evident from the cut away center section of the Figure. A pair of end caps 27 and 28 are provided, having the same generally wedge shaped cross sectional shape as the cooling bar, and are secured to the ends thereof by welding.

In my prior patent, the cooling bars had embedded therein a stainless steel refrigerant tubing bundle that bent back and forth in several passes and had an inlet and an outlet extending beyond the end of the cold bar. This was formed by casting the cooling bar around the tube bundle during the manufacturing process. After machining and finishing of the cooling bar and assembly in a computer, the refrigerant stainless steel tubes which extended out the end of the cooling bar were connected to a refrigeration system for conducting heat away from the cooling bars, and in turn from the circuit modules. The present invention eliminates the need for a stainless steel tubing bundle and also provides improved operation in several areas.

In the cooling bar of this invention, a plurality of parallel holes are drilled through to extend the length of the cooling bar. The number and pattern of the holes can be varied for particular purposes, as explained more fully below, and for illustrative purposes the cooling bar of FIG. 4 is shown cut away in the center to reveal 20 smaller holes and one large hole. The smaller holes are grouped by fours and indicated by the letters A, B, C, D and E. The large hole is indicated by the letter F. These holes are used in conjunction with end caps 27 and 28 to provide refrigerant to flow paths for cooling the bar 10.

Figures 6, 7:
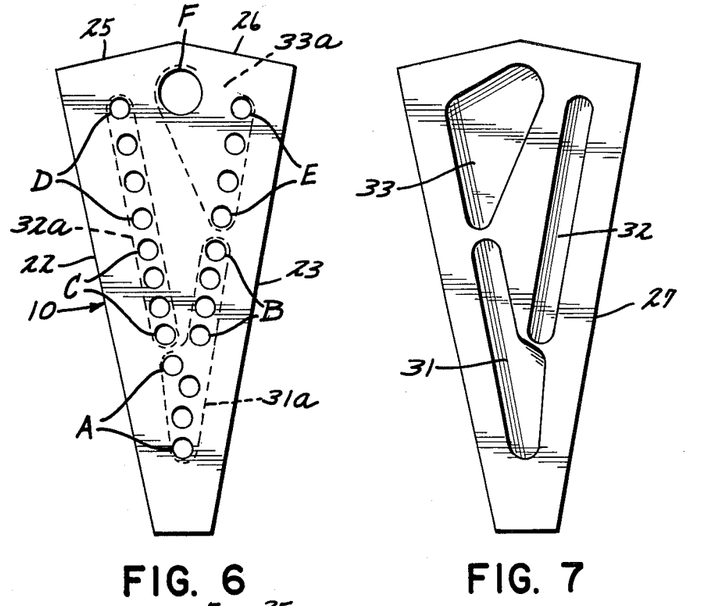
FIG. 6 is a view in section taken along line 6—6 of FIG. 4, showing the top of the cold bar with the end cap removed.
FIG. 7 is a sectional view taken along line 7—7 of FIG. 4, showing the bottom side of the end cap.

FIG. 6 shows an internal hole pattern which is the same as that seen in the broken away sectional portion of FIG. 4, since the holes extend all the way through from top to bottom. FIG. 7 shows the underside of end cap 27. Cap 27 has three machined out well-like zones 31, 32 and 33 which are positioned to connect certain ones of the refrigerant holes in fluid communication with one another by providing refrigerant return paths. Specifically, zone 31, whose outline is indicated as broken line 31a in FIG. 6, provides a common communication zone for the open ends of hole groups A and B. In the same fashion, zone 32, whose outline is indicated in broken line 32a of FIG. 6, provides a common interconnection for the holes of groups C and D, while well 33 provides a common interconnection for the holes of group E and hole F as indicated at broken line 33a.

The shape, spacing and number of the wells 31–33 could be varied to provide intercommunication with different individual holes or groups of holes, and the specific grouping in patterns shown in FIGS. 6 and 7 is exemplary only.

At the lower end of cold bar 10, cap 28 performs a similar function of providing wells for defining refrigerant flow paths for interconnecting different groups of holes, and in addition, providing connections to external refrigeration equipment.

Figure 9:
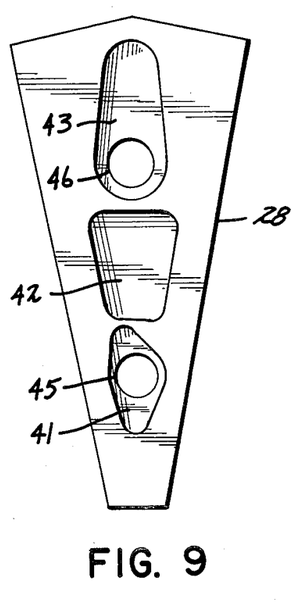
FIG. 9 is a view taken along line 9—9 of FIG. 4.

FIG. 9 shows the inside of end cap 28, that is to say the side that connects against cold bar 23 in use. It has three well areas 41, 42 and 43 which are machined into the cap to provide fluid communication zones for the various holes to the cold bars. In addition, wells 41 and 43 have holes extending therethrough which go to ports for connection to external refrigeration equipment. Specifically, well 41 has an inlet 45 extending therethrough, and well 43 has an outlet 46. Holes 45 and 46 can be threaded for fitting for connection to the external refrigeration equipment.

Figure 8:
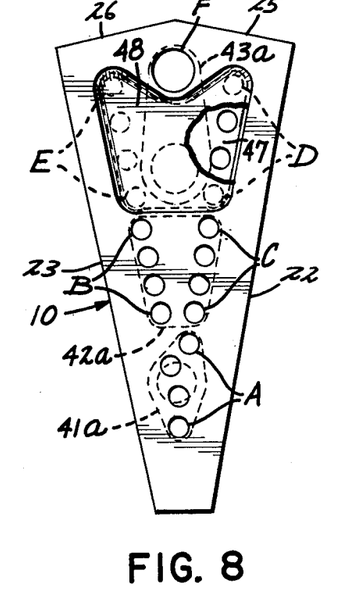
FIG. 8 is a sectional view taken long line 8—8 of FIG. 4.

As seen in FIG. 8, the bottom of cold bar 10 has a well 47 which is recessed from the otherwise flush lower surface of the cold bar. Well 47 extends around and includes the openings of the group E and group D holes, but not including hole F. A plate 48 is shaped to fit across the opening of well 47 and is welded or otherwise secured in place so that intercommunication of refrigerant can take place among and between the openings of groups D and E, but is not allowed to go outside to opening F or otherwise.

In use when end cap 28 is welded or otherwise secured to the bottom of cold bar 10, well 43 provides intercommunication from hole F to external connection outlet 46, as indicated by broken line outline 43a. Well 42 provides intercommunication between and among the holes of groups B and C, as indicated by outline 42a, and well 41 provides fluid communication from the holes of group A to external connection 45 as indicated by broken line 41a.

For the hole pattern and end cap configuration as shown, the cold bar provides an initial up pass for the refrigerant, from inlet 46 through the holes of group A in parallel, then down the holes of group B, back up through the holes of group C, down through the holes of group D, up through the holes of group E, and a final down pass through hole F and out outlet 46.

Figure 5:
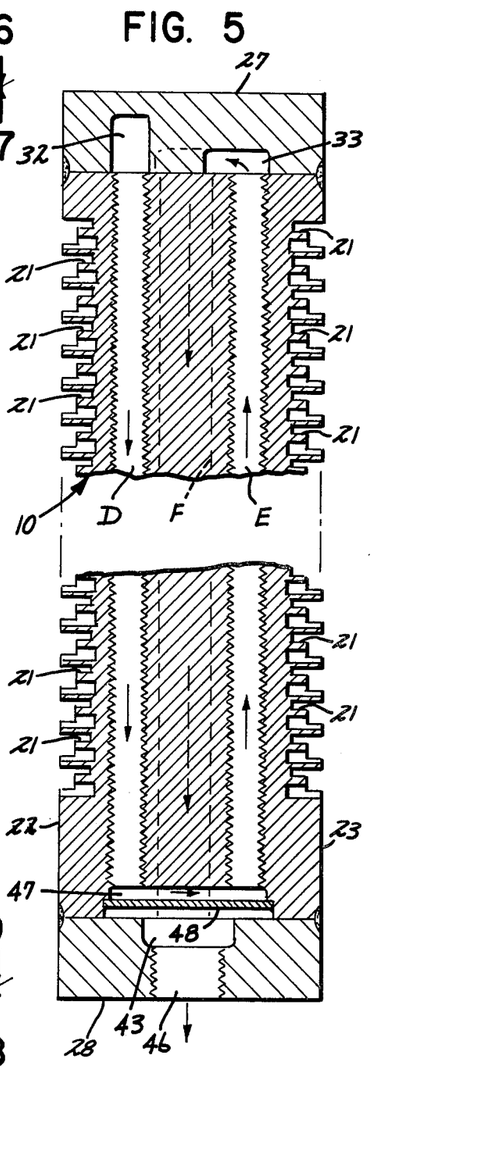
FIG. 5 is a view in section of the cooling bar of FIG. 4, taken along line 5—5 thereof.

In order to improve heat transfer and cooling, the refrigerant flow holes formed in cold bar 10 are threaded, as indicated in the sectional view, FIG. 5. The threads increase the surface area within the holes in contact with the refrigerant fluid, and also disrupt the otherwise smooth continuity of the holes to provide turbulence, which aids in heat transfer by mixing the refrigerant flow and bringing it into more intimate thermal contact with the threads and walls of the hole. Threading is a convenient machining step for forming the turbulence-creating features on the walls of the refrigerant paths, but it will be appreciated that other techniques and structures could be used for the turbulence creation.

While different refrigerant flow paths can be used for particular purposes, the hole arrangement, group and flow pattern shown on the drawings is preferred for the generally wedge-shaped type of cold bar used in the type of chassis construction indicated in FIG. 1. With reference to FIG. 4, the faces 22 and 23 are in contact with the electronic modules and initially receive the heat conducted therefrom. The holes of groups C and D, and B and E, are positioned internally of the cold bar spaced adjacent faces 22 and 23, respectively to remove this heat load. However, in the narrower forward portion of the cold bar, the single groups of holes A is adjacent both faces 22 and 23. It is therefore advantageous to provide the initial pass of refrigerant through the holes of group A to help compensate for the fact that these holes will be removing heat applied to both sides. The next four passes through group B, C, D and E help even out the heat load removal along the rest of the cold bar. The final large hole F providing the last pass is advantageously placed in the wider portion of the cross section near the back, where there is room for it and also where it provides some additional heat removal in view of the fact that passes D and E receive refrigerant that has already absorbed a great amount of heat in the earlier passes. For these reasons, the embodiment shown is preferred in terms of maximum efficiency and heat removal.

It will be appreciated that other hole patterns, and other hole groupings to form the passes, could be used if desired for various purposes. For example, a different cross-sectional shape of a cold bar or a different population of type of heat producing circuitry might require different hole patterns. If it were desired to group a number of relatively higher heat producing modules between certain cold bars, as compared to relatively lower heat producing modules supported by other cold bars, additional or larger refrigerant flow holes could be provided for those cold bars carrying the greater heat load. This could be accomplished by simply providing different drilling patterns for the cold bars and corresponding well areas in the return caps, but without requiring major alterations in the manufacturing process for the cold bars.

It will also be appreciated that while the preferred embodiment herein discloses the provision of well-like areas in the end caps to form the return passages and define the groups for the passes, this could also be done by providing well areas in the ends of the cold bars and using flat end caps, or the wells could be formed jointly in the end of the cold bar and the end cap.

Cooling chassis members in the form of cold plates according to the present invention are used in conjunction with the power supply section 13 of the computer of FIGS. 1 and 2. As seen in greater detail in FIG. 12, each cold plate comprises a generally rectangular aluminum plate 60 to which end caps 61 and 62 are attached. Cold plate 60 has a plurality of refrigerant holes 70-77 drilled therethrough, and these cooperate with well-like return passage areas 85, 86 and 87 in the end cap 61, and 90, 91, 92 and 93 in end cap 62, to form a multiple pass refrigerant path through the cold bar. End cap 61 also has inlet and outlet passages 81, 82 which line up with refrigerant holes 70 and 77, respectively. Refrigeration system connections 83 and 84 are secured in end cap 61 as by threading into tapped holes or the like, to provide external refrigerant communication to passages 81, 82 and therefore to the entire refrigerant path in cold plate 60. As in the case of cold bars 10 described above, the refrigerant holes in cold plate 60 are preferably threaded to provide improved heat transfer for the refrigerant flowing therein.

Figure 10:
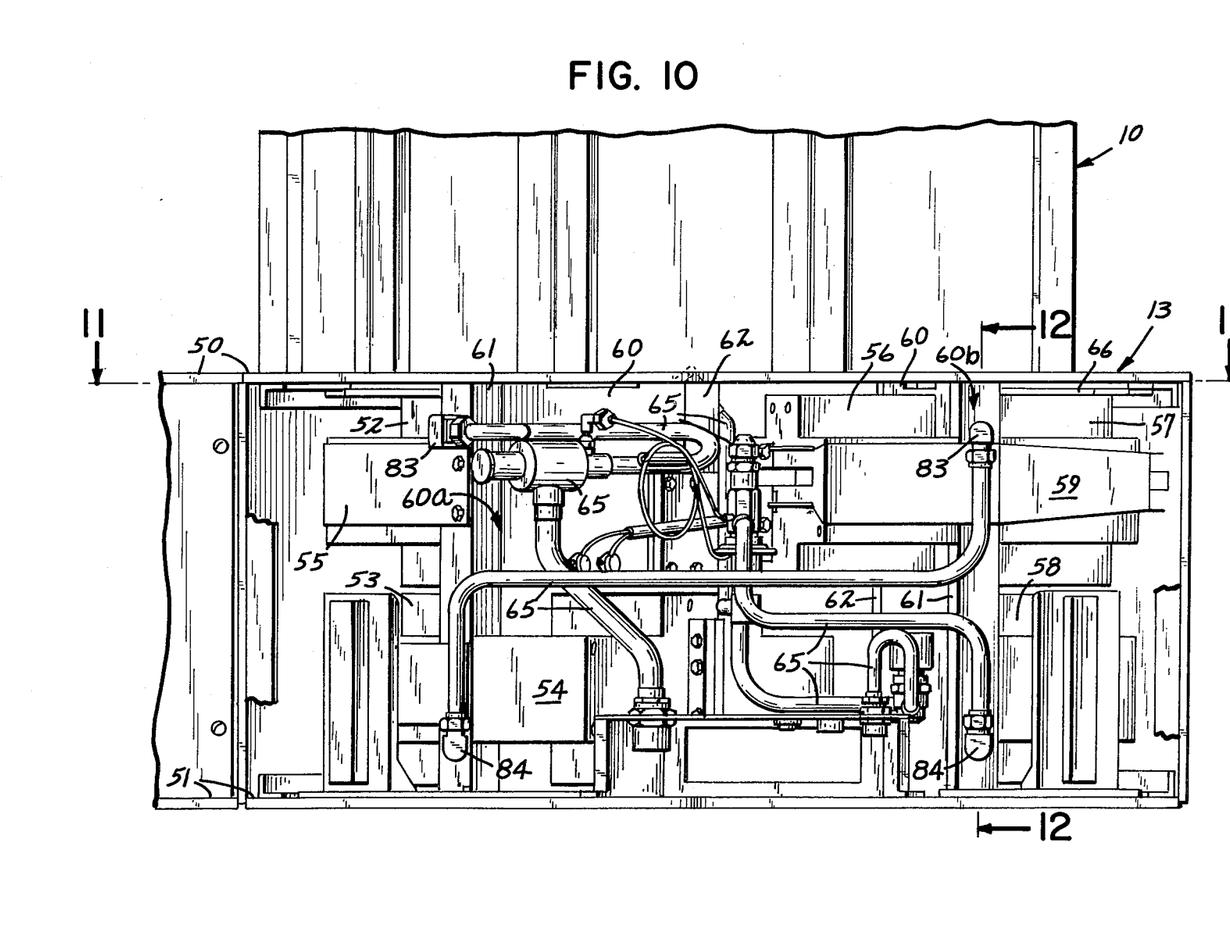
FIG. 10 is a view of the power supply chassis portion of the computer of FIG. 1.
Figure 11:
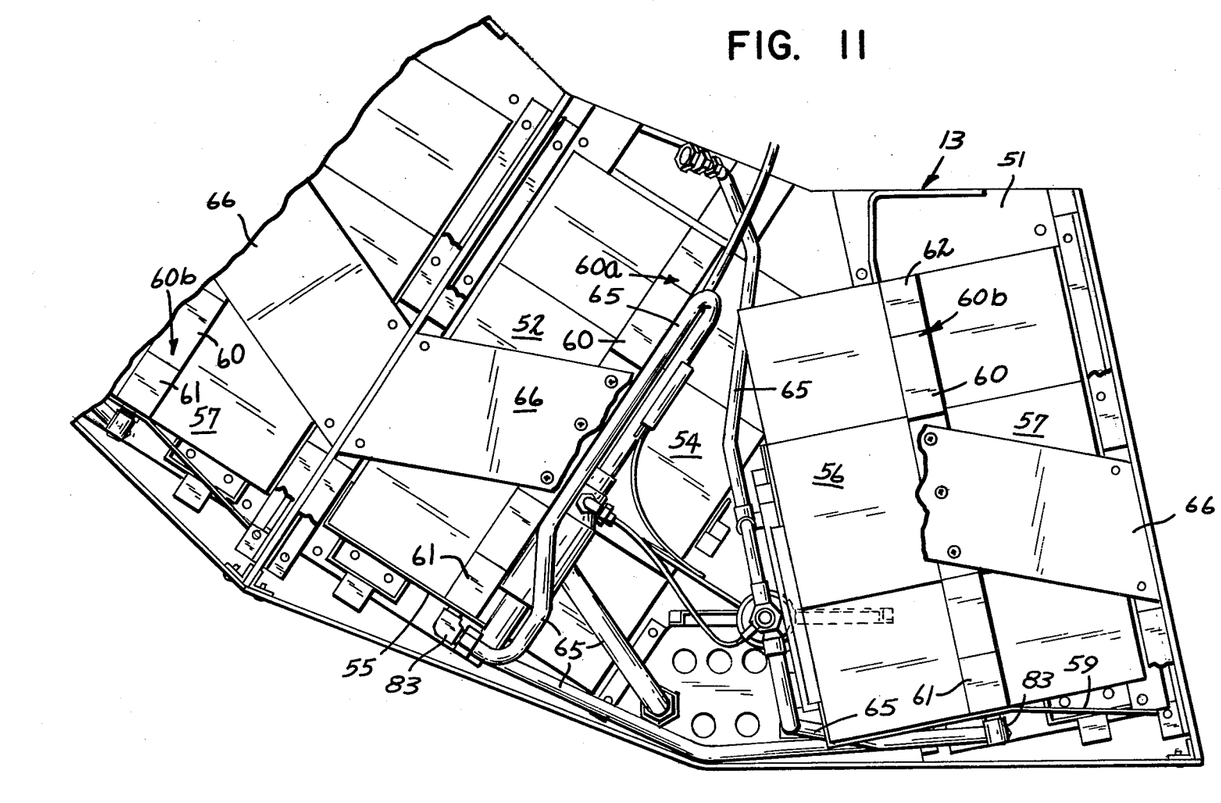
FIG. 11 is a view along line 11—11 of FIG. 12, portions broken away for clarity.
Figure 12:
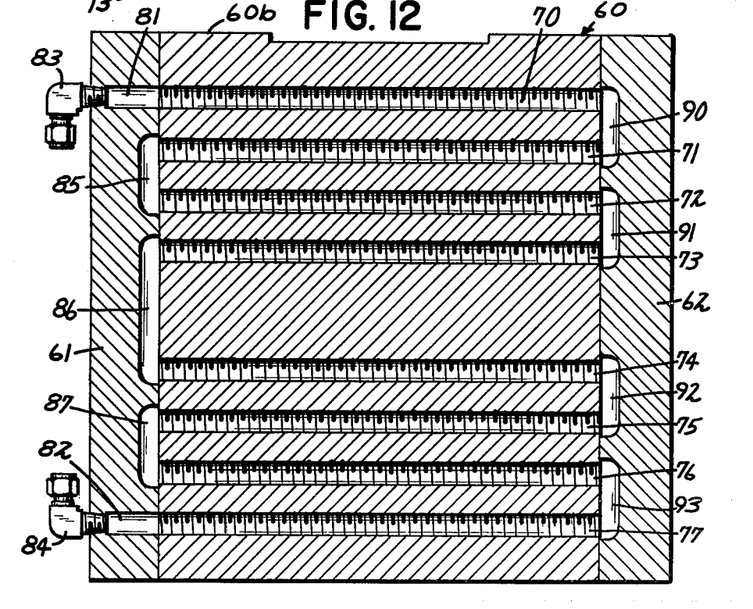
FIG. 12 is a section through a cold plate taken along line 12—12 of FIG. 10.

FIGS. 10 and 11 illustrate the use of a number of cold plates 60 for supporting and cooling electronic power supplies which supply operating voltages for the circuits of the computer of FIGS. 1 and 2. In FIGS. 10 and 11, reference number 13 again generally designates the power supply section of the computer chassis. Between cover portion 50 and base portion 51, a number of cold plates 60 are positioned on edge. Two such cold plates, designated 60a and 60b, are shown in FIGS. 10 and 11. A plurality of frame support members 66 help support the cold bars and secure them to a supporting frame structure for the power supply section. Power supplies 52, 53 and 54 are attached to cold plate 60a by suitable means, which may include bracket 55. In a similar manner, power supplies 56, 57 and 58 are secured to cold plate 60b by suitable means which may include bracket 59. Suitable refrigerant conduit connections, generally designated by reference number 65 in FIG. 12, are connected to the refrigerant inlet and outlet connections 83, 84 of the cold plates, from a conventional refrigeration system to supply circulating refrigerant to the cold bars.

In this manner the heat produced by the power supplies is conducted to the cold plates and removed by the refrigerant circulating therein. As in the case of the cold bars 10 described above, cold plates 60 can be easily adapted to suit individual cooling applications. The size, spacing and grouping of the refrigerant holes can be altered by changing the drilling pattern and corresponding return passages to accommodate different heat loads as required for a given application.

The improved cooling system for electronic assemblies of this invention thus provides cooling bars and cooling plates having improved heat load handling capacity, ease and economy of manufacture, and adaptability for optimizing heat removal capability for specific applications.

What is claimed is:

1. A cooling system for an electronic assembly, comprising:
   a plurality of elongate chassis members of high heat conductive material;
   means for positioning said chassis members in parallel relation spaced to receive electronic circuit modules between adjacent pairs of chassis members;
   said chassis members having means along adjacent sides thereof for receiving electronic modules in heat conducting contact therewith;
   said chassis members having a plurality of refrigerant holes extending through the length thereof and spaced internally thereof generally adjacent the side areas thereof which receive said electronic modules;
   pairs of end caps for attachment to opposite ends of said chassis members adjacent the ends of said refrigerant holes, said end caps cooperating with said chassis members for forming refrigerant passages interconnecting selected ones of said refrigerant holes into groups to form refrigerant flow paths having multiple passes through said chassis members; and
   refrigerant inlets and outlets in said end caps for said chassis members in fluid communication with the refrigerant flow paths for connection to an external refrigeration system for circulating refrigerant therethrough, whereby heat generated in the electronic modules is conducted through the chassis members and removed by refrigerant circulating through the flow path therein.

2. A chassis member for supporting and cooling electronic modules, comprising:

an elongate cast cold bar of high heat conductive material;

said cold bar having clamping means along at least one side thereof for holding heat conductive edge portions of a plurality of electronic modules;

said cold bar having a plurality of threaded refrigerant holes extending therethrough from end to end generally parallel with the longitudinal axis of the cold bar and spaced within the cold bar generally adjacent the side areas which hold said electronic modules;

a top cap attached to one end of said cold bar across the openings therein of said refrigerant holes, said top cap cooperating with said cold bar to define well areas forming return passages that interconnect groups of said refrigerant holes;

a bottom cap attached to the other end of said cold bar across the openings of said refrigerant holes, said bottom cap and said cold bar cooperating to define well areas forming passages and return passages interconnecting selected ones of said refrigerant holes into groups such that refrigerant flow paths are formed in the cold bar having multiple passes therethrough; and said bottom cap having refrigerant inlet and outlet means connecting to said passages to permit the connection of refrigeration equipment thereto to establish refrigerant circulation through said flow paths.

3. A chassis for supporting and cooling electronic modules, comprising:

a plurality of elongate cold bars of heat conductive material, said cold bars having a generally wedge shaped cross section with a pair of opposite side portions that diverge at an acute angle with respect to each other from a relatively narrow front portion to a relatively thicker back portion, with a plurality of slots along said side portions for receiving heat conductive edges of a plurality of electronic modules;

means positioning said cold bars in spaced arrangement with one another with adjacent side portions parallel to one another and spaced to receive a plurality of electronic modules therebetween;

said cold bars each having a first group of threaded refrigerant holes extending therethrough generally parallel with the longitudinal axis of the cold bar and positioned adjacent said front portion and said side portions;

said cold bars each having additional groups of threaded refrigerant holes extending therethrough generally parallel with the longitudinal axis of the cold bar and positioned generally adjacent said side portions extending in a pattern from said first group toward said back portion;

said cold bars each having a further refrigerant hole extending therethrough generally parallel with the longitudinal axis of the cold bar and positioned generally between said further groups of holes and generally adjacent said back portion; and top and bottom caps attached respectively to the tops and bottoms of the cold bars across the openings therein of said refrigerant holes, said bottom caps having a refrigerant inlet in fluid communication with said first group of refrigerant holes and a refrigerant outlet in fluid communication with said further refrigerant hole, and said top and bottom caps cooperating with the ends of said cold bars to form return passages that interconnect said first group, said additional groups and said further refrigerant hole to define multiple pass refrigerant paths through said cold bars.

* * * * *